United States Patent
Ehman et al.

(10) Patent No.: US 8,508,229 B2
(45) Date of Patent: Aug. 13, 2013

(54) SHEAR MODE PRESSURE-ACTIVATED DRIVER FOR MAGNETIC RESONANCE ELASTOGRAPHY

(75) Inventors: Eric C Ehman, Rochester, MN (US); Kiaran P McGee, Rochester, MN (US); Richard L Ehman, Rochester, MN (US)

(73) Assignee: MAYO Foundation for Medical Education and Research, Rochester, MN (US)

( * ) Notice: Subject to any disclaimer, the term of this patent is extended or adjusted under 35 U.S.C. 154(b) by 383 days.

(21) Appl. No.: 12/847,712

(22) Filed: Jul. 30, 2010

(65) Prior Publication Data

US 2011/0025333 A1 Feb. 3, 2011

Related U.S. Application Data

(60) Provisional application No. 61/229,776, filed on Jul. 30, 2009.

(51) Int. Cl.
*G01R 33/565* (2006.01)
(52) U.S. Cl.
USPC ............................ 324/318; 324/316; 324/307
(58) Field of Classification Search
USPC . 324/300–322; 600/407–435; 382/128–131; 73/646, 662; 424/423; 427/2.25
See application file for complete search history.

(56) References Cited

U.S. PATENT DOCUMENTS

| 5,592,085 | A | 1/1997 | Ehman |
| 5,952,828 | A | 9/1999 | Rossman et al. |
| 5,977,770 | A | 11/1999 | Ehman |
| 6,037,774 | A | 3/2000 | Felmlee et al. |
| 6,486,669 | B1 | 11/2002 | Sinkus et al. |
| 7,034,534 | B2 | 4/2006 | Ehman et al. |
| 8,281,663 | B2 * | 10/2012 | Ehman et al. ................ 73/662 |
| 2006/0240065 | A1 * | 10/2006 | Chen ............................ 424/423 |
| 2009/0209847 | A1 * | 8/2009 | Li ................................. 600/421 |
| 2009/0232964 | A1 * | 9/2009 | Chen ........................... 427/2.25 |
| 2010/0049029 | A1 * | 2/2010 | Li et al. ........................ 600/410 |
| 2011/0025333 | A1 * | 2/2011 | Ehman et al. ................ 324/318 |
| 2011/0092798 | A1 * | 4/2011 | Kolipaka et al. ............. 600/410 |
| 2012/0010497 | A1 * | 1/2012 | Ehman et al. ................ 600/410 |
| 2012/0259201 | A1 * | 10/2012 | Chen et al. ................... 600/411 |
| 2012/0269415 | A1 * | 10/2012 | Glaser et al. ................. 382/131 |

OTHER PUBLICATIONS

Bensamoun et al, Determination of Thigh Muscle Stiffness Using Magnetic Resonance Elastography, Journal of Magnetic Resonance Imaging, 23:242-247 (2006).

* cited by examiner

*Primary Examiner* — Melissa Koval
*Assistant Examiner* — Tiffany Fetzner
(74) *Attorney, Agent, or Firm* — Quarles & Brady, LLP

(57) ABSTRACT

A magnetic resonance elastography ("MRE") driver that can produce shear waves in a subject without relying on mode conversion of longitudinal waves is disclosed. More specifically, the MRE driver includes a pneumatic driver located remotely from a magnetic resonance imaging ("MRI") system which is operable in response to an applied electrical current to oscillate, a pressure-activated driver that is positioned on a subject in the MRI system, and a tube that is in fluid communication, at one end, with the pneumatic driver. The pressure-activated driver includes a base plate and a driver plate having a region between them that receives the tube. Oscillations of the pneumatic driver produce a pressure wave in the tube that causes the driver plate to vibrate. The driver plate rests against the subject of interest to apply a corresponding shear oscillatory force to the subject during the MRE examination.

16 Claims, 11 Drawing Sheets

SHEAR MODE PRESSURE-ACTIVATED DRIVER FOR MAGNETIC RESONANCE ELASTOGRAPHY

CROSS-REFERENCE TO RELATED APPLICATIONS

This application claims the benefit of U.S. Provisional Patent Application Ser. No. 61/229,776, filed on Jul. 30, 2009, and entitled "Shear Mode Pressure-Activated Driver for Magnetic Resonance Elastography."

STATEMENT REGARDING FEDERALLY SPONSORED RESEARCH

This invention was made with government support under EB001981 awarded by the National Institute of Biomedical Imaging and Bioengineering. The government has certain rights in the invention.

FIELD OF THE INVENTION

The field of the invention is magnetic resonance imaging ("MRI") systems and methods. More particularly, the invention relates to drivers for use in magnetic resonance elastography ("MRE").

BACKGROUND OF THE INVENTION

Magnetic resonance imaging ("MRI") uses the nuclear magnetic resonance ("NMR") phenomenon to produce images. When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems. These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then performing a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

It has been found that MR imaging can be enhanced when an oscillating stress is applied to the object being imaged in a method called MR elastography ("MRE"). The method requires that the oscillating stress produce shear waves that propagate through the organ, or tissues to be imaged. These shear waves alter the phase of the MR signals, and from this the mechanical properties of the subject can be determined. In many applications, the production of shear waves in the tissues is merely a matter of physically vibrating the surface of the subject with an electromechanical device such as that disclosed in U.S. Pat. No. 5,592,085. Shear waves may also be produced in the breast and prostate by direct contact with the oscillatory device. Also, with organs like the liver, the oscillatory force can be directly applied by means of an applicator that is inserted into the organ.

A number of driver devices have been developed to produce the oscillatory force needed to practice MRE. As disclosed in U.S. Pat. Nos. 5,977,770; 5,952,828; 6,037,774 and 6,486,669, these typically include a coil of wire through which an oscillating current flows. This coil is oriented in the polarizing field of the MRI system such that it interacts with the polarizing field to produce an oscillating force. This force may be conveyed to the subject being imaged by any number of different mechanical arrangements. Such MRE drivers can produce large forces over large displacement, but they are constrained by the need to keep the coil properly aligned with respect to the polarizing magnetic field. In addition, the current flowing in the driver coil produces a magnetic field that can alter the magnetic fields during the magnetic resonance pulse sequence resulting in undesirable image artifacts.

Another approach is to employ piezoelectric drivers as disclosed in, for example, U.S. Pat. Nos. 5,606,971 and 5,810,731. Such drivers do not produce troublesome disturbances in the scanner magnetic fields when operated, but they are limited in the forces they can produce, particularly at larger displacements. Piezoelectric drivers can also be oriented in any direction since they are not dependent on the polarizing magnetic field direction for proper operation.

Yet another approach is to employ an acoustic driver as described in, for example, U.S. Pat. No. 7,034,534, in which the acoustic driver is located remotely from the MRI system and is acoustically coupled by a tube to a passive actuator positioned on the subject being imaged. The passive actuator does not disturb the magnetic fields and it may be positioned on the subject and oriented in any direction.

Generally, pneumatic drivers generate shear waves by directly coupling the driver to the object of interest (e.g. the chest wall) or by driving a plate that is mechanically coupled to the specimen under investigation. Both techniques share a common driver: a modified audio speaker driven by a waveform generator and amplifier. Previous pneumatic drivers have included, for example, a thin cylinder with one face constructed of thick plastic and the other constructed of a thin, plastic. For example, the thin plastic face may be around one-sixteenth of an inch. A thin tube connected to the thick plastic face introduces sound waves into the cylinder that, in turn, cause the thin plastic face of the driver to vibrate. The vibrations result from the pressure wave traveling down the tube that is connected to an audio speaker.

While such a configuration has been successfully used in a variety of applications, it produces shear waves in the subject under investigation by the process of mode conversion of a longitudinal wave into a shear wave. Mode conversion produces complex wave patterns due to the fact that shear waves are generated at tissue interfaces whose geometry is often complex and multilayered. Additionally, these tissue interfaces serve as multiple sources for shear wave production, resulting in constructive and destructive interference patterns that are difficult to model and separate. Additionally, longitudinal waves introduce bulk motion into the subject, which produces phase errors that affect the estimation of the shear wavelength and, hence, stiffness estimates.

It would therefore be desirable to have a magnetic resonance elastography driver that produces shear waves in a subject under examination without relying on the mode conversion of longitudinal waves. By directly producing shear waves in a subject without relying on mode conversion of longitudinal waves, the complexity of the MRE inversion process would be substantially reduced, and errors introduced by the use of longitudinal waves would be mitigated.

SUMMARY OF THE INVENTION

The present invention is a magnetic resonance elastography ("MRE") driver that can produce shear waves in a subject without interfering with the magnetic resonance imaging ("MRI") system and without the mode conversion of longitudinal waves. More specifically, the MRE driver includes a pneumatic driver located remotely from the MRI system that is operable in response to an applied electrical current to oscillate, a pressure-activated driver that is positioned on a subject in the MRI system, and a tube that is in fluid communication, at one end, with the pneumatic driver. The pressure-activated driver includes a base plate and a driver plate arranged in spaced relation to each other such that a region is defined therebetween to receive the elastic tube. Oscillations of the pneumatic driver produce a pressure wave in the tube that causes the driver plate in the pressure-activated driver to vibrate. The driver plate rests against the subject of interest to apply a corresponding shear oscillatory force to the subject during the MRE examination.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
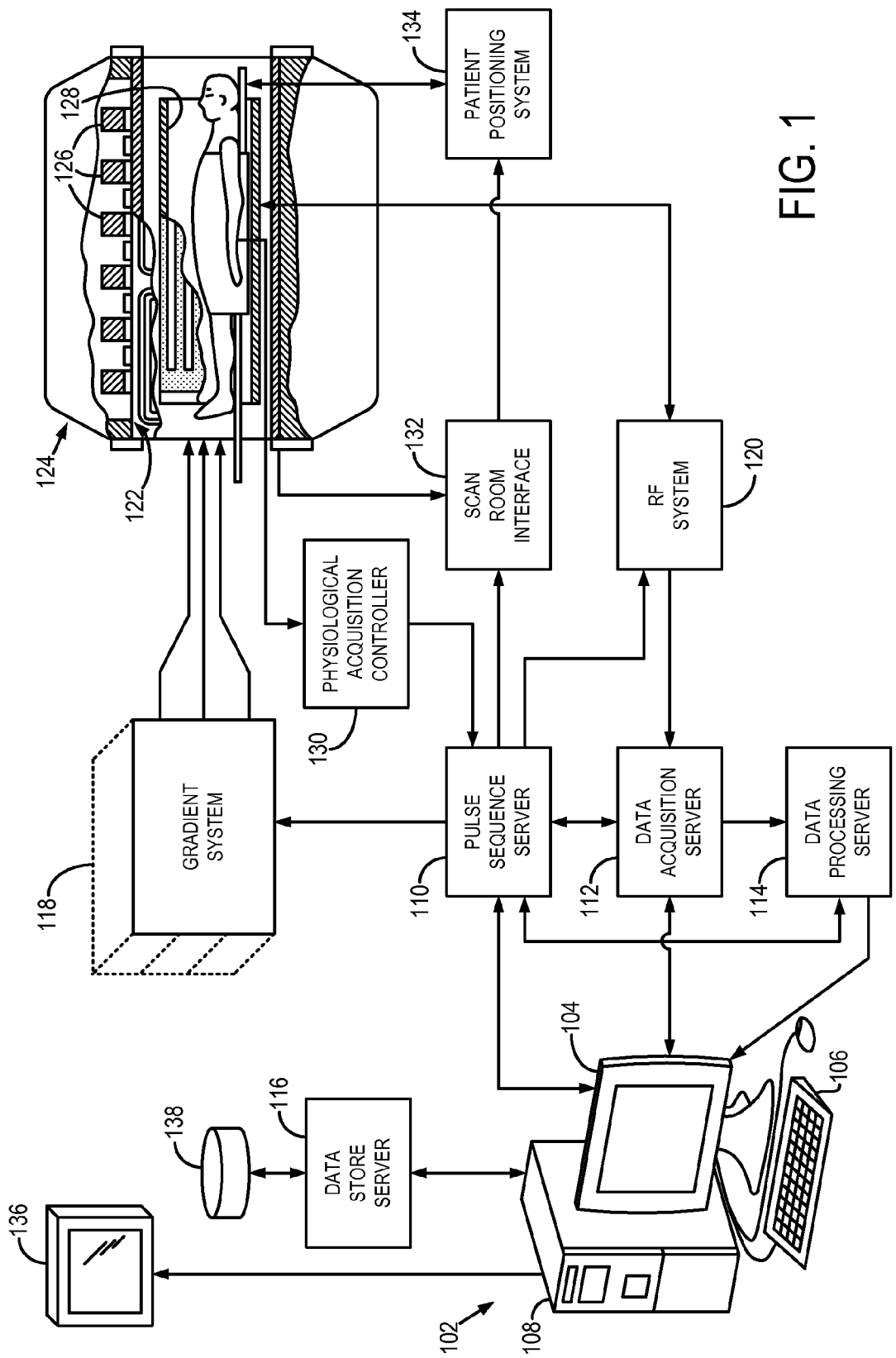
FIG. 1 is a block diagram of a magnetic resonance imaging ("MRI") system that employs the present invention.

Referring particularly to FIG. 1, the preferred embodiment of the invention is employed in a magnetic resonance imaging ("MRI") system 100. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114, and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad \text{Eqn. (1)};$$

and the phase of the received MR signal may also be determined:

$$\phi = \tan^{-1}\left(\frac{Q}{I}\right). \qquad \text{Eqn. (2)}$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. The data acquisition server 112 may also be employed to process MR signals used to detect the arrival of contrast agent in a magnetic resonance angiography ("MRA") scan. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 2:
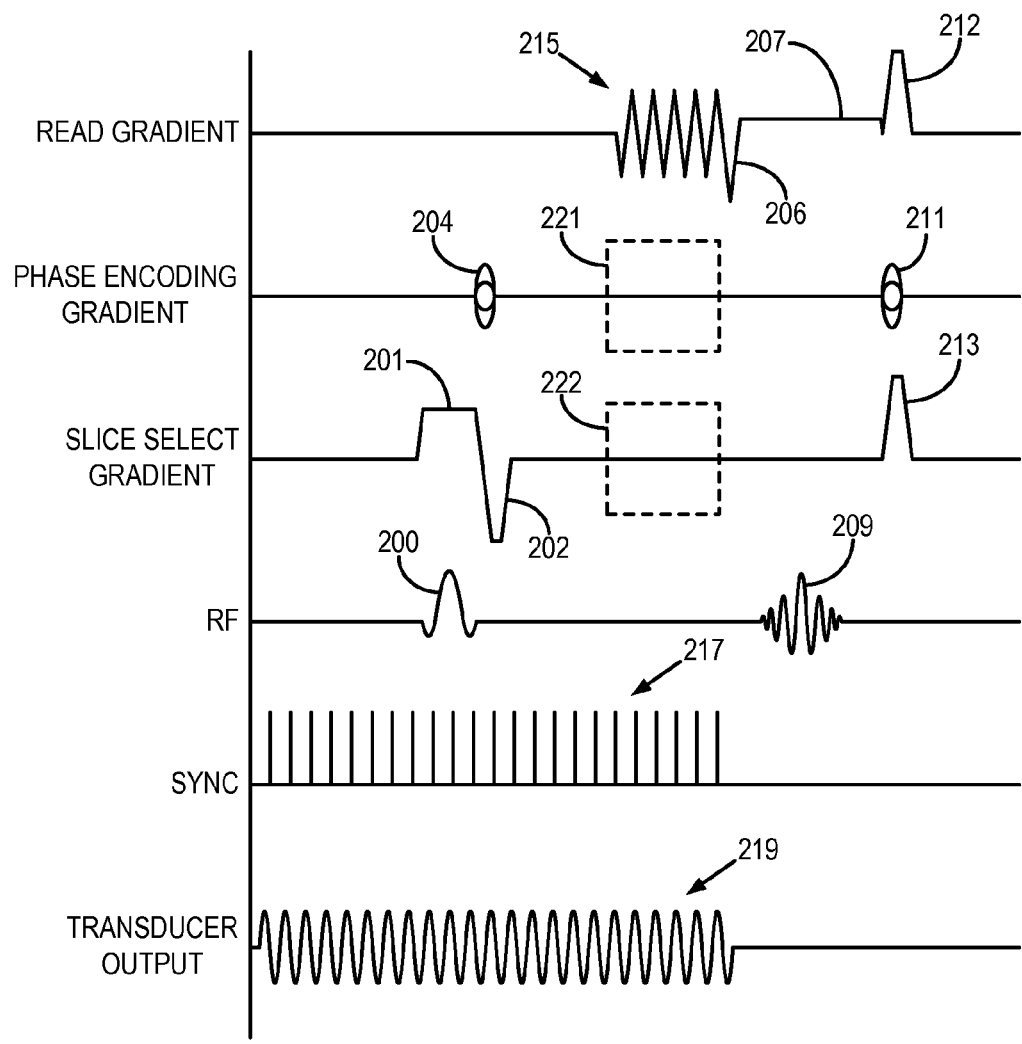
FIG. 2 is a graphic representation of an exemplary magnetic resonance elastography ("MRE") pulse sequence employed by the MRI system of FIG. 1.

Referring particularly to FIG. 2, an exemplary pulse sequence, which may be used to acquire magnetic resonance ("MR") data according to an embodiment of the present invention, is shown. The pulse sequence is fundamentally a 2DFT pulse sequence using a gradient recalled echo. Transverse magnetization is produced by a selective 90 degree radiofrequency ("RF") excitation pulse 200 that is produced in the presence of a slice select gradient, $G_z$, pulse 201 and followed by a rephasing gradient pulse 202. A phase encoding gradient, $G_y$, pulse 204 is then applied at an amplitude and polarity determined by the view number of the acquisition. A read gradient, $G_x$, is applied as a negative dephasing lobe 206, followed by a positive readout gradient pulse 207. An MR echo signal 209 is acquired 40 milliseconds after the RF excitation pulse 200 during the readout pulse 207 to frequency encode the 256 digitized samples. The pulse sequence is concluded with spoiler gradient pulses 212 and 213 along read and slice select axes, and a rephasing gradient pulse 211 is applied along the phase encoding axis ("$G_y$-axis"). As is well known in the art, this rephasing pulse 211 has the same size and shape, but opposite polarity of the phase encoding pulse 204. The pulse sequence is repeated 128 times with the phase encoding pulse 204 stepped through its successive values to acquire a 128-by-256 array of complex MR signal samples that comprise the data set.

An alternating magnetic field gradient is applied after the transverse magnetization is produced and before the MR signal is acquired. In the pulse sequence illustrated in FIG. 2, the read gradient, $G_x$, is used for this function and is alternated in polarity to produce bipolar, gradient waveforms 215. The frequency of the alternating gradient 215 is set to the same frequency used to drive the MRE transducer, and it typically has a duration of 25 milliseconds. At the same time, the pulse sequence server 110 produces sync pulses as shown at 217, which have the same frequency as and have a specific phase relationship with respect to the alternating gradient pulses 215. These sync pulses 217 are used to produce the drive signals for the magnetic resonance elastography ("MRE") transducer to apply an oscillating stress 219 to the patient. To insure that the resulting waves have time to propagate throughout the field of view, the sync pulses 217 may be turned on well before the pulse sequence begins, as shown in FIG. 2.

The phase of the MR signal 209 is indicative of the movement of the spins. If the spins are stationary, the phase of the MR signal is not altered by the alternating gradient pulses 215, whereas spins moving along the read gradient axis ("$G_x$-axis") will accumulate a phase proportional to their velocity. Spins which move in synchronism and in phase with the alternating magnetic field gradient 215 will accumulate maximum phase of one polarity, and those which move in synchronism, but 180 degrees out of phase with the alternating magnetic field gradient 215 will accumulate maximum phase of the opposite polarity. The phase of the acquired MR signal 209 is thus affected by the "synchronous" movement of spins along the $G_x$-axis.

The pulse sequence in FIG. 2 can be modified to measure synchronous spin movement along the other gradient axes ($G_y$ and $G_z$). For example, the alternating magnetic field gradient pulses may be applied along the phase encoding axis ("$G_y$-axis") as indicated by dashed lines 221, or they may be applied along the slice select axis ("$G_z$-axis") as indicated by dashed lines 222. Indeed, they may be applied simultaneously to two or three of the gradient field directions to "read" synchronous spin movements along any desired direction.

MRE may be implemented using most types of MR imaging pulse sequences. Gradient echo sequences can be readily modified to incorporate the alternating gradient as illustrated in the above-described embodiment. In some cases, however, the characteristics of a gradient echo sequence may not be ideal for a particular application of the technique. For example, some tissues (such as those with many interfaces between materials with dissimilar magnetic susceptibilities) may have a relatively short $T_2^*$ relaxation time and, therefore, may not provide enough signal to obtain a noise-free image at the required echo delay time. In this setting, a spin echo implementation of the invention may be ideal, because for a given echo delay time ("TE"), this pulse sequence is much less sensitive to susceptibility effects than a gradient echo sequence. When a spin echo pulse sequence is used, the alternating magnetic field gradient can be applied either before and/or after the 180 degree RF inversion pulse. However, if the alternating gradient is applied both before and after the RF inversion pulse, the phase of the alternating magnetic field gradient must be inverted 180 degrees after the RF inversion pulse in order to properly accumulate phase.

The physical properties of tissue are measured using MRE by applying a stress and observing the resulting strain. For example a tension, pressure, or shear is applied to a subject and the resulting elongation, compression, or rotation is observed. By measuring the resulting strain, elastic properties of the tissue such as Young's modulus, Poisson's ratio, shear modulus, and bulk modulus can be calculated. Moreover, by applying the stress in all three dimensions and measuring the resulting strain, the elastic properties of the tissue can be completely defined.

The attenuation of the strain wave can be estimated by observing the rate at which the strain decreases as a function of distance from the stress producing source. From this, the viscous properties of the gyromagnetic medium may be estimated. The dispersion characteristics of the medium can be estimated by observing the speed and attenuation of the strain waves as a function of their frequency. Dispersion is potentially a very important parameter for characterizing tissues in medical imaging applications.

Figure 3:
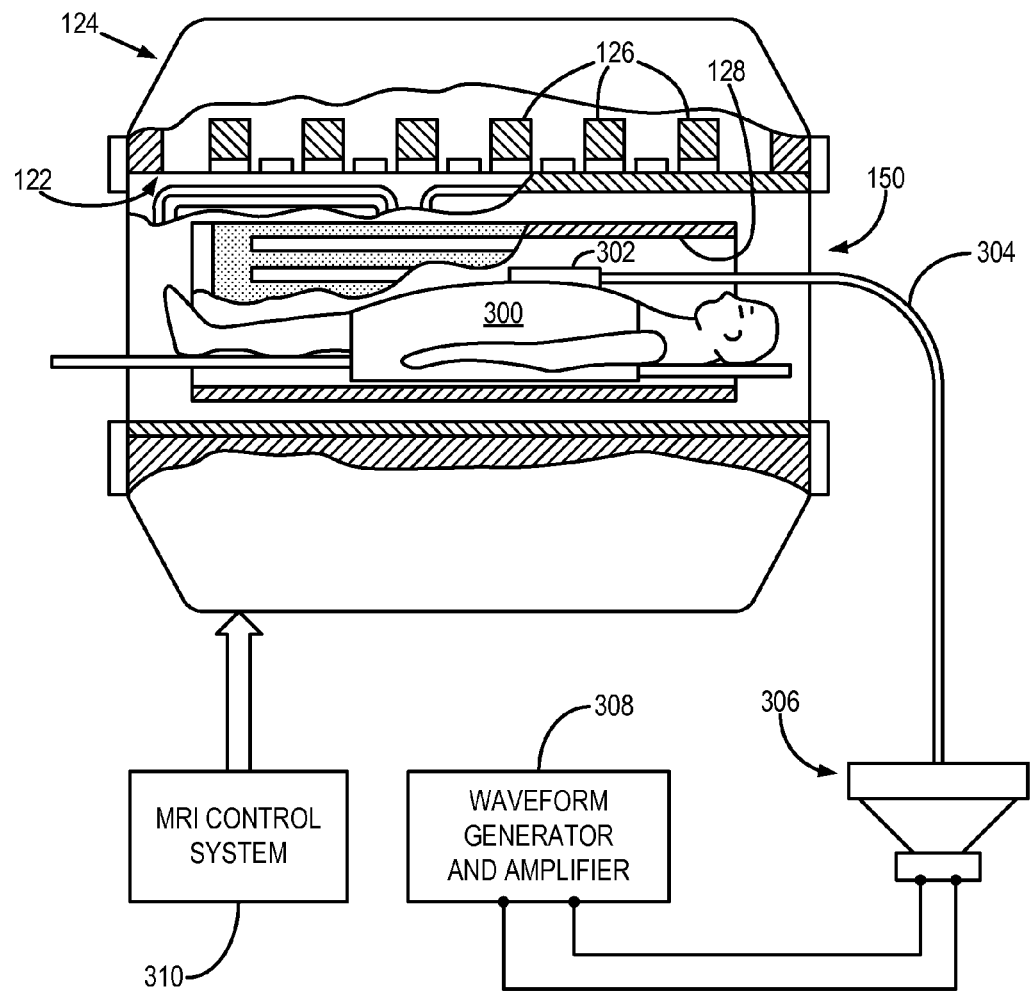
FIG. 3 is a block diagram of a portion of the MRI system of FIG. 1 showing an MRE driver array, wave generator, and amplifier assembly.

Referring to FIG. 3, the present invention is an MRE driver that may be placed on the subject 300 and energized to produce an oscillating stress. It includes a pressure-activated driver 302, which is positioned over the region of interest in the subject 300 and is connected by means of an inlet tube 304 to a remotely located pneumatic driver assembly 306. The pneumatic driver assembly 306 is remote from the bore 150 of the magnet assembly 124 in the sense that it is away from the strong magnet fields produced by the magnet assembly 124 where its operation is not impeded by those fields, and where its operation will not perturb the MRI system magnetic fields. The pneumatic driver assembly 306 is electrically driven by a waveform generator and amplifier 308, which in turn is controlled by the pulse sequence server 110 in the MRI system control 310. The MRI system control 310 directs the MRI system to perform an MRE scan by driving the RF coil 128, and the gradient coils 122 in the magnet assembly 124 to perform a series of pulse sequences, while enabling the waveform generator 308 at the proper moment during each pulse sequence to apply an oscillatory stress to the subject 300.

Figure 4:
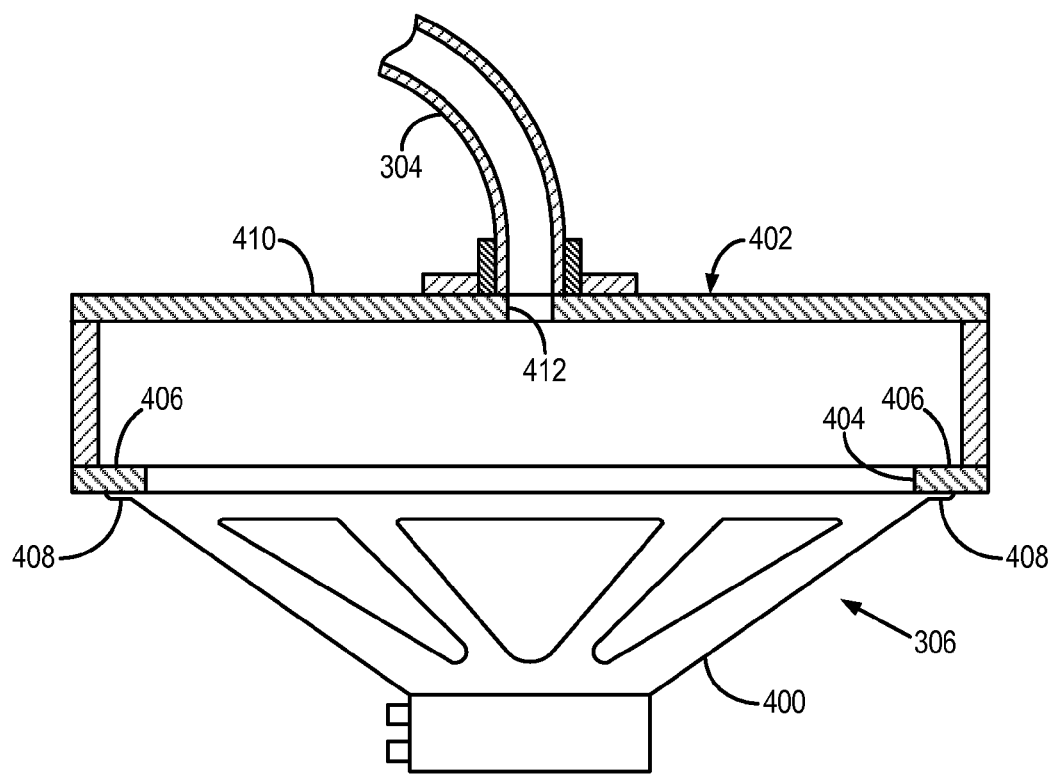
FIG. 4 is a pictorial view of an exemplary pneumatic driver used in the system of FIG. 1.

Referring particularly to FIG. 4, the pneumatic driver assembly 306 includes a loudspeaker 400 mounted on one side of a thin enclosure 402. An exemplary loudspeaker 400 is a speaker, such as a 15 inch speaker manufactured by Resonant Engineering and sold as Model SE15. Such a speaker has a resonant frequency of 30 hertz ("Hz") and can handle 1000 watts ("W") peak power or 600 W root-mean-square ("rms"). The enclosure 402 is constructed of a rigid material such as polycarbonate, and is, for example, a rectangular enclosure having dimensions of 18 inches by 18 inches by 1.5 inches. The enclosure 402 large opening 404 wall 406 and a flange 408 on the loudspeaker 400 fasten together such that the speaker 400 directs acoustic energy directly into the enclosure 402.

One end of the tube 304 connects to an opposing wall 410 of enclosure 402 and is in fluid communication with its interior by an output opening 412. As a result, the acoustic energy produced by the loudspeaker 400 is directly coupled to one end of the inlet tube 304 through the thin enclosure 402.

The inlet tube 304 is made of a material which is flexible, but which is not elastic. The inlet tube 304 is non-elastic such that it does not stretch in response to the variations in air pressure caused by the acoustic energy it conveys. The flexibility enables it to be fed along a winding path between the subject in the magnet and the remote site of the pneumatic driver assembly 306. For example, the inlet tube 304 may be twenty feet long and have an inside diameter of one inch. Exemplary such inlet tubes 304 are made of a vinyl material sold under the trademark "TYGON" (Saint-Gobain Corporation, La Défense, France) and have a wall thickness of approximately one-eighth inch. As a result, the acoustic energy is efficiently conveyed from the driver assembly 306 to the pressure-activated driver 302.

Figure 5A:
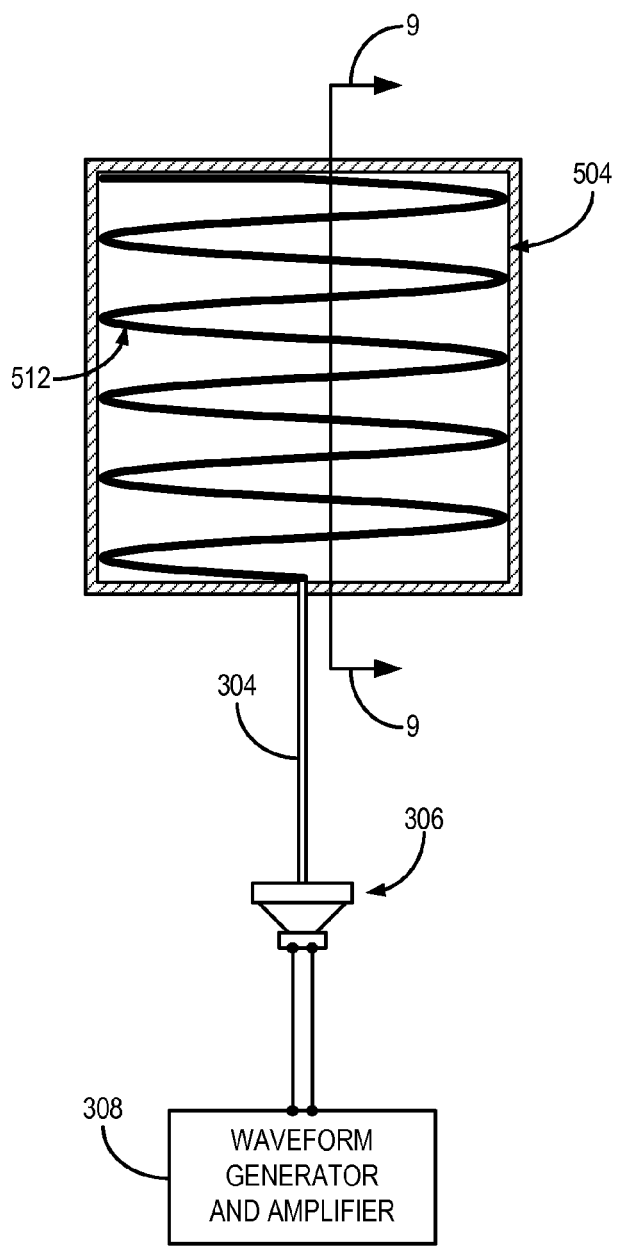
FIG. 5A is a graphic representation of a configuration of the MRE driver system of the present invention.
Figure 5B:
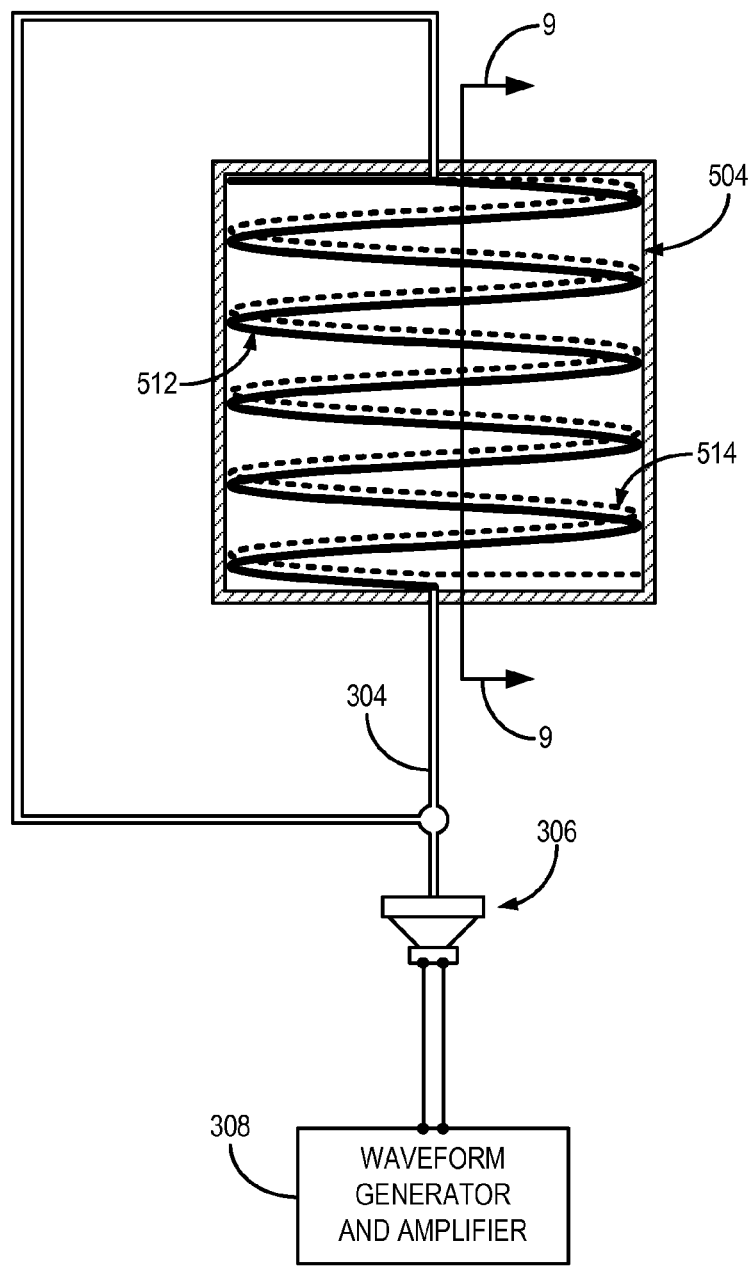
FIG. 5B is a graphic representation of alternative configuration of the MRE driver system shown in FIG. 5A.

Referring now to FIG. 5A a graphic representation of an embodiment of the pressure-activated MRE driver system of the present invention is shown. Such embodiment will be discussed in brief herein, and in more detail below. The embodiment shown in FIG. 5A includes a single tube 512, a base plate (not shown), a moveable plate 504, and recoil system (not shown). FIG. 5B shows an alternative configuration, in which a second tube 514 is introduced that is 180 degrees out of phase from the first tube 512. The phase delay produced when employing this second tube 514 provides an ability to double the shear wave amplitude by providing force on the top plate during both positive and negative phases of a sinusoidal pressure waveform. In FIG. 5B, it is also possible to change the phase delay by modifying the effective length of the tube 512, thereby providing the generation of beat modes. Additionally, other means for altering the phase delay may be employed, including adding a sliding "trombone" type tube system, and a valve or shunt system that effectively increases or decreases the length of the tube 512. For example, a sliding tube system or a valve system can be added to the inlet tube 304 so that the effective length of the tube 512 can be adjusted. Alternatively, separate pneumatic drivers could be employed, and driven such that there is a phase delay between the two sources.

Figure 6A:
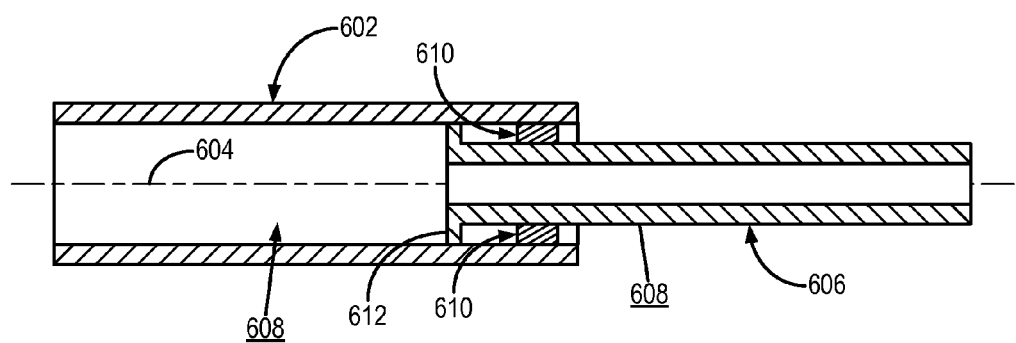
FIGS. 6A and 6B are pictorial representations of an exemplary sliding tube system for adjusting a phase delay in a pressure wave conveyed to the MRE driver system of FIGS. 5A and 5B.
Figure 6B:
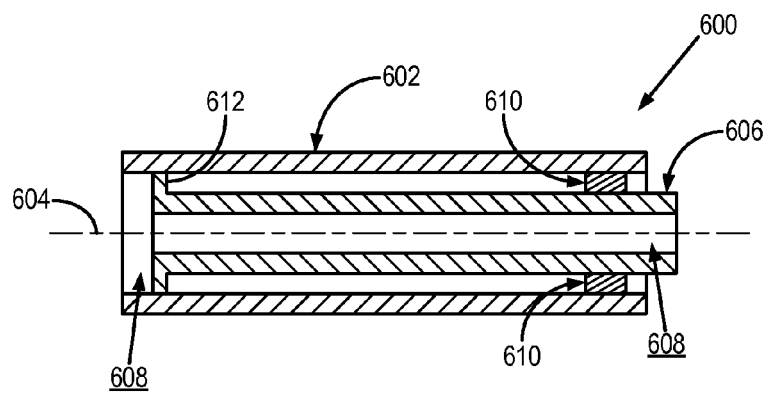

An exemplary sliding tube system defining a pressure wave path is illustrated in FIGS. 6A and 6B. The sliding tube system 600 includes a first tube portion 602 extending along an axis of extension 604 and a second tube portion 606 also extending along the axis of extension 604. The first and second tube portions, 602 and 606, are slidably positioned with respect to each other such that either can be slid along the direction of the axis of extension 604 while maintaining a fluidly sealed interior 608 therebetween. A cylindrical seal 610 interposed between the first and second tube portions, 602 and 606, engages a flange 612 on the second tube portion 606, thereby preventing the first and second tube portions, 602 and 606, from disengaging each other. By sliding the first and second tube portions, 602 and 606, with respect to each other, the effective length of the tube 512 is increased or decreased, thereby providing a phase delay in the conveyance of the pressure wave in the tube system 600 to the driver system.

Figure 7A:
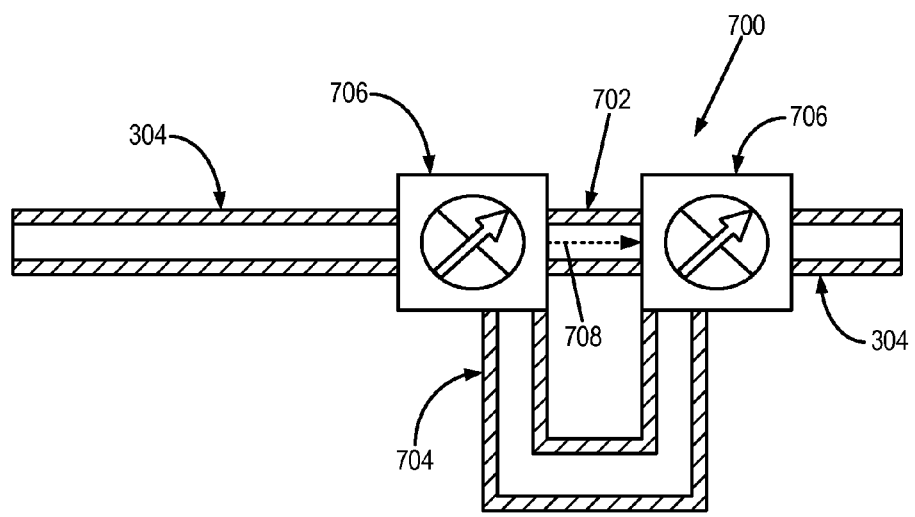
FIGS. 7A and 7B are pictorial representations of an exemplary valve system for adjusting a phase delay in a pressure wave conveyed to the MRE driver system of FIGS. 5A and 5B.
Figure 7B:
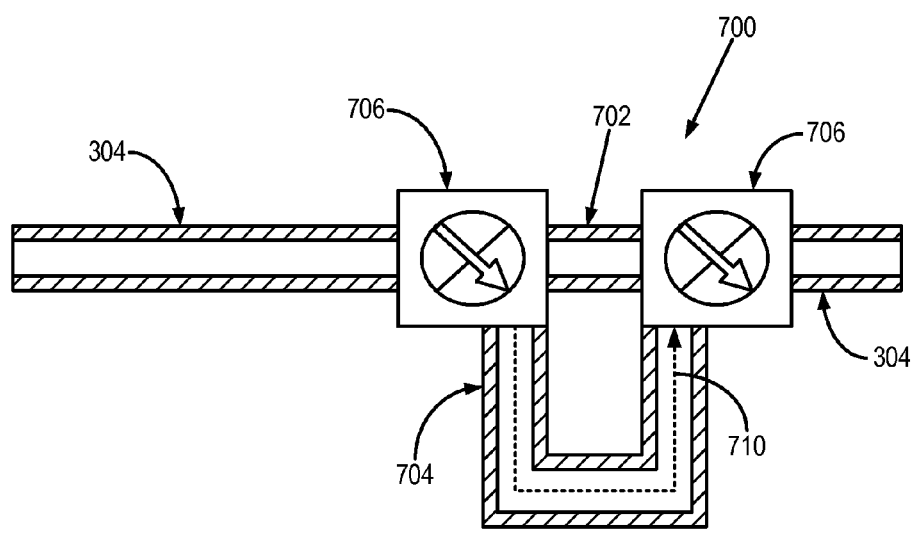

An exemplary valve system is illustrated in FIGS. 7A and 7B. The valve system 700 acts as an effective by-pass that creates two path lengths for the sound wave. The valve system includes a first tube 702 defining a first wave path, such as a short path, and a second tube 704 defining a second wave path, such as a long path. Disposed between the first and second tube paths, 702 and 704, are two or more valves 706. As explained later, more than two valves 706 can be employed with multiple different tubes defining multiple different wave paths, thereby providing a configuration in which the length of the tube 512 can be effectively changed to any multiple or fraction of the wavelength of interest. When in an open position (FIG. 7A), the valves 706 provide a pathway, identified by dashed arrow 708, for a pressure wave to be conveyed to the driver system along the first tube 702. However, when the valves 706 are placed in a closed position (FIG. 7B), a pathway, identified by dashed arrow 710, for a pressure wave to be conveyed to the driver system along the second tube 704 is provided.

Figure 8:
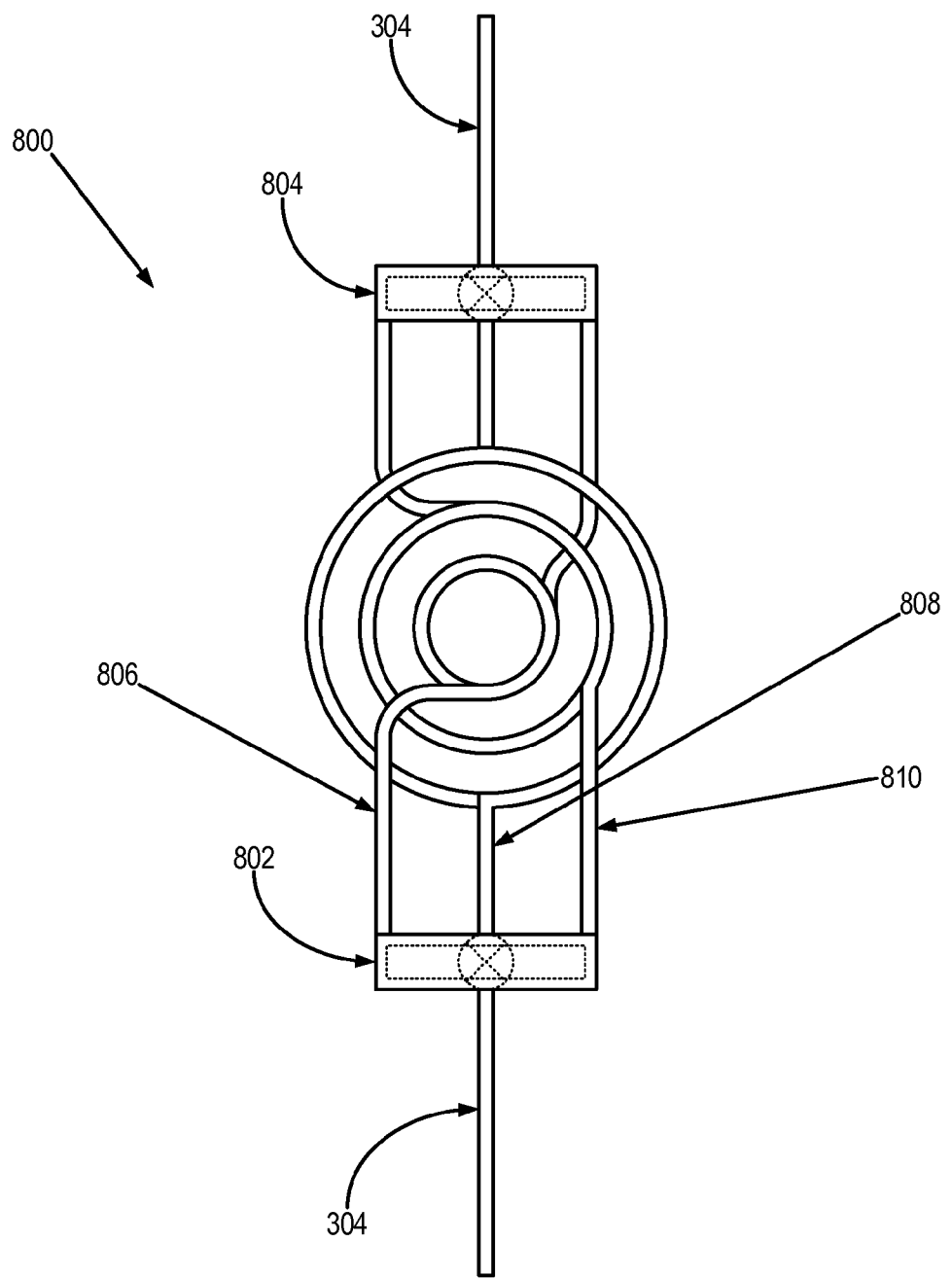
FIG. 8 is a pictorial representation of an exemplary manifold system for adjusting a phase delay in a pressure wave conveyed to a coupled MRE driver system.

In another configuration, illustrated in FIG. 8, a manifold system is utilized to provide a phase delay to a pressure wave conveyed to an MRE driver system by using the manifold system to select a tube of a particular length. The manifold system 800 includes an input manifold 802 and an output manifold 804 interposed between the inlet tube 304, for example, after the inlet line is split by a T-valve. Alternatively, the manifold system is provided to a second inlet tube attached either to the same or a different pneumatic driver as inlet tube 304. Each manifold 802, 804, connects to a plurality of tubes, such as tubes 806, 808, and 810. Together, the manifolds 802, 804 and the tubes, 806, 808, 810, define a plurality of different wave paths through which a pressure wave can be conveyed to the driver system. For convenience, the tubes 806, 808, 810 may be coiled into loops and stacked concentrically, as illustrated in FIG. 8.

Figure 9A:
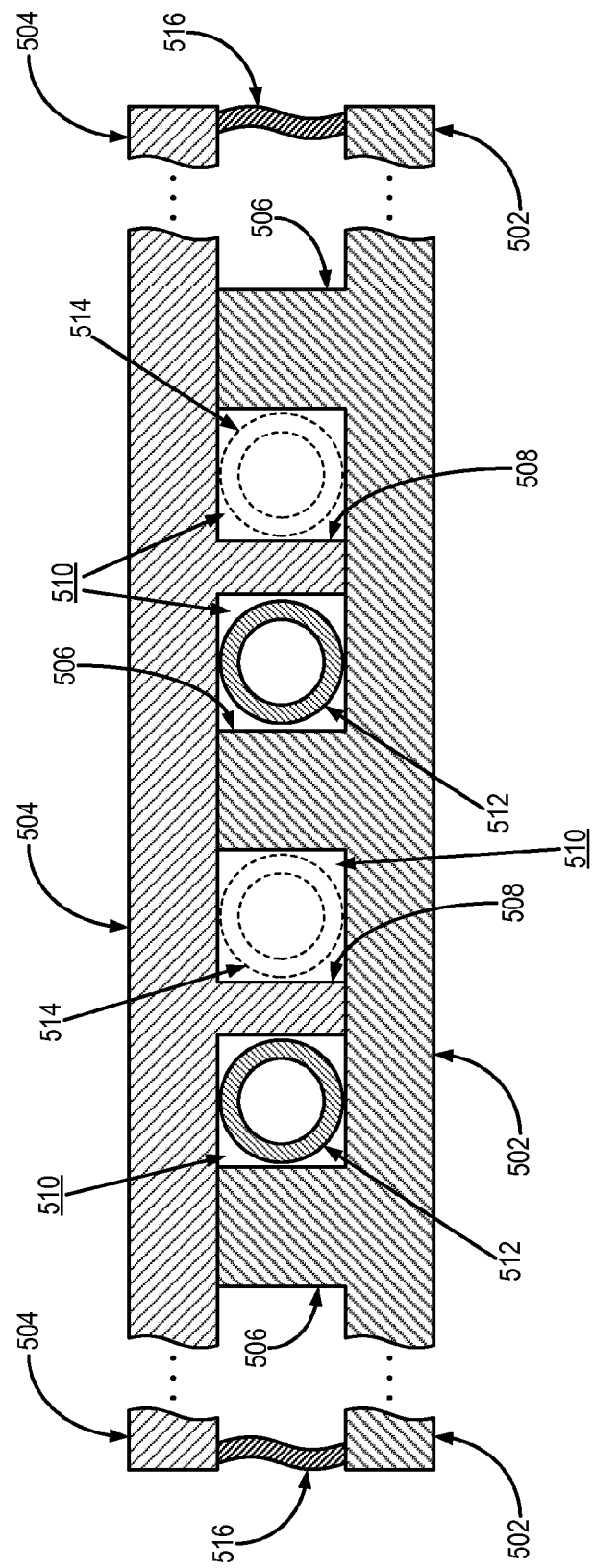
FIG. 9A is a cross-sectional view of the MRE driver system of FIG. 5A.

Referring particularly now to FIG. 9A, the aforementioned embodiment of the pneumatic driver system shown in FIG. 5A is shown in cross-section along view 9. The MRE driver includes a base plate 502 and a moveable top plate 504. Extending from the base plate 502 are a plurality of protrusions 506 that extend from the base plate 502 towards the moveable plate 504. A plurality of protrusions 508 also extend from the moveable plate 504 towards the base plate 502. The protrusions, 506 and 508, may be ridges or a series of pegs, for example, and can be formed as continuous portions of the plates, 502 and 504, or affixed thereto, such as by nylon screws or the like. The base plate 502 and moveable plate 504 are arranged in a spaced relation such that the protrusions, 506 and 508, define a plurality of channels 510 configured to receive a tube 512.

By way of example, the protrusions, 506 and 508, are configured such that the protrusions 506 extending from the base plate 502 are interleaved with the protrusions 508 extending from the moveable plate 504. Further, the protrusions 506 extending from the base plate 502 may not be present along the full length of the base plate 502, just as the protrusions 508 extending from the moveable plate 504 may not be present along the full length of the moveable plate 504. In such a configuration, the plurality of channels 510 formed by the protrusions, 506 and 508, form a single, continuous and winding passage in which the tube 512 is placed.

An acoustic pressure wave traveling down the tube 512 provides a positive pressure within the tube 512 that moves the moveable plate 504 of the driver system via contact with the protrusions 508 formed thereon. For example, sinusoidal pressure waveforms within the tube 512 create shear motion of the moveable plate 504 relative to the base plate 502. In an alternative configuration, a second tube 514 is positioned to lie in another plurality of channels 516 formed by the protrusions, 506 and 508. In such a configuration, the second tube 514 is positioned such that it is 180 degrees out of phase with the first tube 512. As noted above, the phase delay produced when utilizing this second tube 514 provides an opportunity to double the shear wave amplitude by providing force on the moveable plate 504 during both positive and negative phases of a sinusoidal pressure waveform. In general, it is also possible to change the phase delay by modifying the length of the tube 512, thereby creating a configuration in which beat modes are produced. It should be appreciated that the tube 512 need not be circular in cross-section. In fact, and in the alternative, a more ovular cross section may be advantageous since such a configuration will direct the outward force of the pressure wave in a more discriminatory manner. Thus, as used herein, the term "tube" refers to any such elongated enclosure having flexible or semi-flexible walls that define a region in which a fluid can pass, whether circular in cross-section or not.

The moveable plate 504 should have sufficient elastic recoil to ensure that when the pressure within the tube 512 is zero, or negative, the moveable plate 504 will return to its original position. To achieve this, a recoil system, such as, for example, elastic straps 516, are disposed on either ends of both plates, 502 and 504, in a neutral position. This recoil system provides a longitudinal recoil of the top plate 504 after it is displaced by a positive pressure waveform passing through the tube 512. In addition, the recoil system is selected such that it provides a support for the weight of the moveable plate 504 and subject. For example, when the recoil system includes elastic strips 516, the thickness of the elastic strips 516 is selected such that the elastic strips 516 also provide the desired support.

Figure 9B:
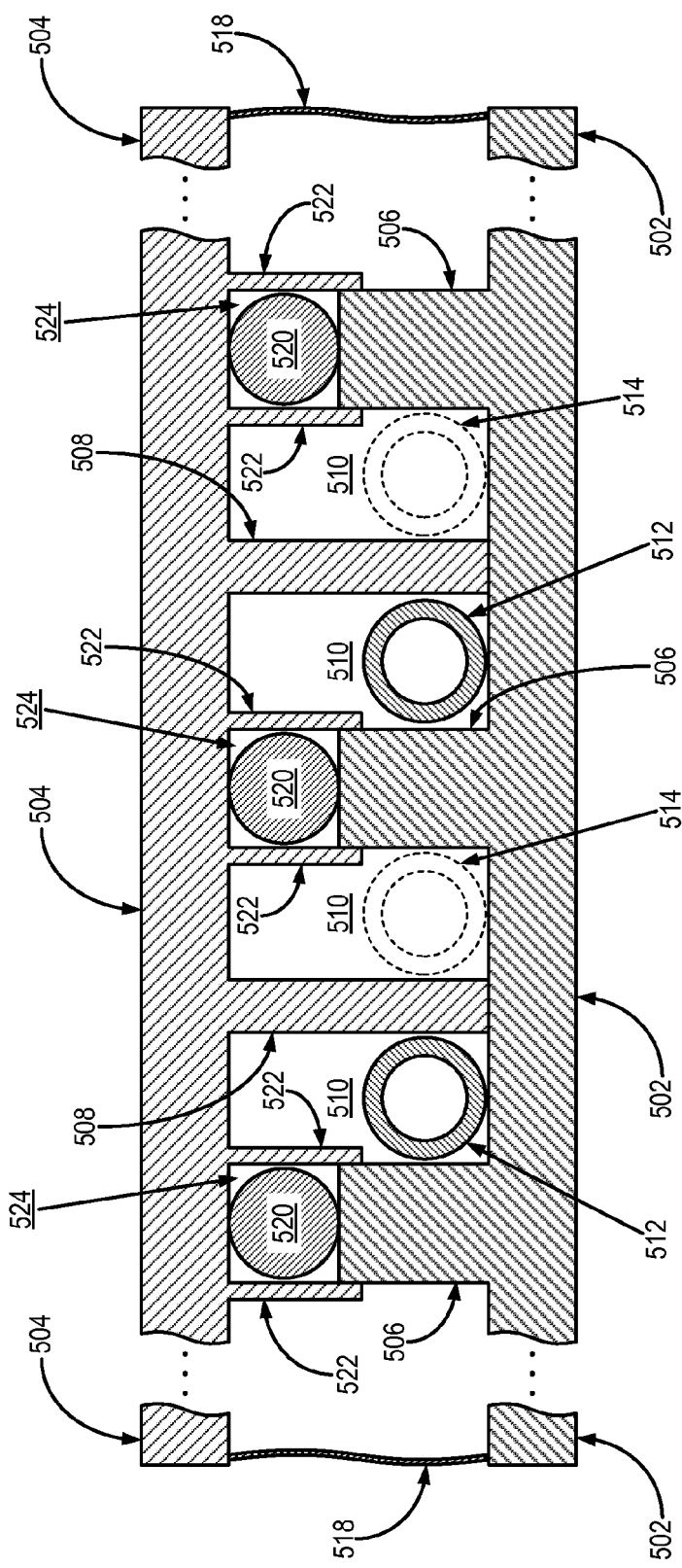
FIG. 9B is a cross-sectional view of an alternative configuration of the MRE driver system of FIG. 5A.

Referring particularly now to FIG. 9B, an alternative configuration of the pneumatic driver system shown in FIG. 5A is shown in cross-section along view 9. This alternative configuration includes a recoil system including thinner elastic strips 518 and a set of magnetic resonance ("MR") compatible bearings 520. These MR compatible bearings 520 are coupled to the base plate 502, for example at the protrusions 506, and act to reduce friction during operation of the driver and to support the weight of the moveable plate 504 and subject. In particular, a second set of protrusions 522 are formed in the moveable plate 504 and extending toward the base plate 502. This second set of protrusions 522 forms a plurality of spaces 524 in which the bearings 520 may be placed.

It is an aspect of the present invention to provide a driver system for producing a shear stress on a subject while performing a magnetic resonance elastography ("MRE") scan with a magnetic resonance imaging ("MRI") system, the shear stress producing a shear wave in the subject that has a substantially doubled amplitude than produced by other configurations of the driver system. This alternative configuration includes another tube 514 that conveys a pressure wave that is 180 degrees out of phase with the pressure wave conveyed by the tube 512. The addition of this out-of-phase pressure wave being conveyed to the protrusions 508 extending from the moveable plate 504 results in a driving force on the driver system during both positive and negative phases of a sinusoidal pressure waveform. In general, and as noted above, it is also possible to change the phase delay between the two pressure waves by modifying the length of the tube 512, thereby creating an instance where beat modes are produced and conveyed to the protrusions 508.

The present invention has been described in terms of one or more preferred embodiments, and it should be appreciated that many equivalents, alternatives, variations, and modifications, aside from those expressly stated, are possible and within the scope of the invention.

The invention claimed is:

1. A driver system configured for producing a shear stress on a subject while performing a magnetic resonance elastography (MRE) scan with a magnetic resonance imaging (MRI) system, the driver system comprising:
    an MRE driver comprising:
        a base plate;
        a moveable plate configured to be in contact with the subject and having extended therefrom a plurality of protrusions that create a space between the base plate and the moveable plate;
        a pneumatic driver configured to produce acoustic energy; and
        a tube that is in fluid communication with the pneumatic driver and extending through the space between the base plate and the moveable plate, the tube being configured to convey a pressure wave produced by the acoustic energy to the plurality of protrusions such that the movable plate is moved relative to the base plate, thereby producing a shear stress on the subject.

2. The driver system as recited in claim 1 in which the base plate has extending therefrom another plurality of protrusions that further create the space between the base plate and the moveable plate.

3. The driver system as recited in claim 1 further comprising a recoil system configured to oppose the moveable plate as it moves relative to the base plate.

4. The driver system as recited in claim 1 further comprising a plurality of bearings coupled to the base plate and configured to reduce friction between the base plate and the moveable plate as the moveable plate moves relative to the base plate.

5. The driver system as recited in claim 4 in which the plurality of protrusions include a plurality of protrusions that extend from the moveable plate to form a plurality of spaces for receiving the bearings.

6. The driver system as recited in claim 1 in which the plurality of protrusions include at least one of a ridge and a peg.

7. The driver system as recited in claim 1 in which the space between the base plate and the moveable plate is formed as a plurality of channels formed between the plurality of protrusions.

8. The driver system as recited in claim 7 further comprising another tube that is in fluid communication with the pneumatic driver and extending through the space between the base plate and the moveable plate, the another tube being configured to convey another pressure wave produced by the acoustic energy to the plurality of protrusions.

9. The driver system as recited in claim 8 in which the another tube is configured such that the another pressure wave is conveyed to the plurality of protrusions out of phase with the pressure wave conveyed by the tube.

10. The driver system as recited in claim 1 further comprising a phase delay system for producing a phase delay between two or more pressure waves conveyed by the tube, the phase delay system including at least one of a sliding tube, at least one valve, and a shunt.

11. The driver system as recited in claim 10 in which a first path length and a second path length are formed in the tube by the at least one valve, thereby providing an effective bypass for the pressure wave.

12. The driver system as recited in claim 1 wherein the base plate and the moveable plate are arranged opposed to one another.

13. The driver system as recited in claim 1 further comprising another pneumatic driver configured to produce acoustic energy, wherein the pneumatic driver and the another pneumatic driver are driven such that there is a phase delay between pressure waves produced by the pneumatic driver and the another pneumatic driver.

14. The driver system as recited in claim 1 wherein the plurality of protrusions form grooves to create the space.

15. The driver system as recited in claim 14 wherein the tube in fluid communication with the pneumatic driver is received by the grooves between the base plate and the moveable plate.

16. A driver system configured for producing a shear stress on a subject while performing a magnetic resonance elastography (MRE) scan with a magnetic resonance imaging (MRI) system, the driver system comprising:
    an MRE driver comprising:
        a base plate;
        a moveable plate configured to be in contact with the subject and having extended therefrom a plurality of protrusions that create a space between the base plate and the moveable plate;
        a pneumatic driver configured to produce acoustic energy;
        a tube that is in fluid communication with the pneumatic driver and extending through the space between the base plate and the moveable plate, the tube being configured to convey a pressure wave produced by the acoustic energy to the plurality of protrusions such that the movable plate is moved relative to the base plate, thereby producing a shear stress on the subject; and in which the at least one valve includes a selected number of valves, the selected number of valves being chosen so that a length of the tube can be changed to a similarly selected fraction of a wavelength of interest.

* * * * *